United States Patent [19]

Isota et al.

[11] Patent Number: 5,093,637
[45] Date of Patent: Mar. 3, 1992

[54] MODULATION DEVICE WITH INPUT SIGNAL MODIFICATION FOR CORRECTION OF AMPLIFIER NONLINEARITIES

[75] Inventors: Yoji Isota; Gen Toyoshima; Noriharu Suematsu; Yukio Ikeda; Tadashi Takagi; Shuji Urasaki, all of Kanagawa, Japan

[73] Assignee: Mitsubishi Denki Kabushiki Kaisha, Tokyo, Japan

[21] Appl. No.: 631,506

[22] Filed: Dec. 21, 1990

[30] Foreign Application Priority Data

Dec. 27, 1987 [JP] Japan .................. 1-341055

[51] Int. Cl.[5] .................. H03C 3/08; H03K 7/10
[52] U.S. Cl. .................. 332/103; 375/58; 375/60
[58] Field of Search .................. 332/103, 104, 145; 375/52, 53, 54, 55, 56, 57, 58, 59, 60, 67

[56] References Cited

U.S. PATENT DOCUMENTS 4,787,094 11/1988 Eguchi .................. 332/103 X

Primary Examiner—David Mis
Attorney, Agent, or Firm—Rothwell, Figg, Ernst & Kurz

[57] ABSTRACT

In a modulation system using an amplitude and a phase of a carrier wave as information such as a QPSK system, a modulation device modifies an input signal series to compensate the nonlinear characteristics of an amplifier located at a later stage, and provides a carrier wave modulated by the modified signal series to the amplifier. A first arithmetic circuit obtains an amplitude and a phase of an input signal by calculation. A ROM is set with correction data corresponding to the calculated amplitude so as to compensate the nonlinearity of the amplifier. A modification value generating circuit and a RAM output an amount of compensation so as to further modify the correction data according to part of an output signal from the amplifier to compensate amplifier characteristic changes due to temperature variations and the like. A second arithmetic circuit provides a signal series produced from the modified amplitude and phase to a quadrature modulator.

5 Claims, 4 Drawing Sheets

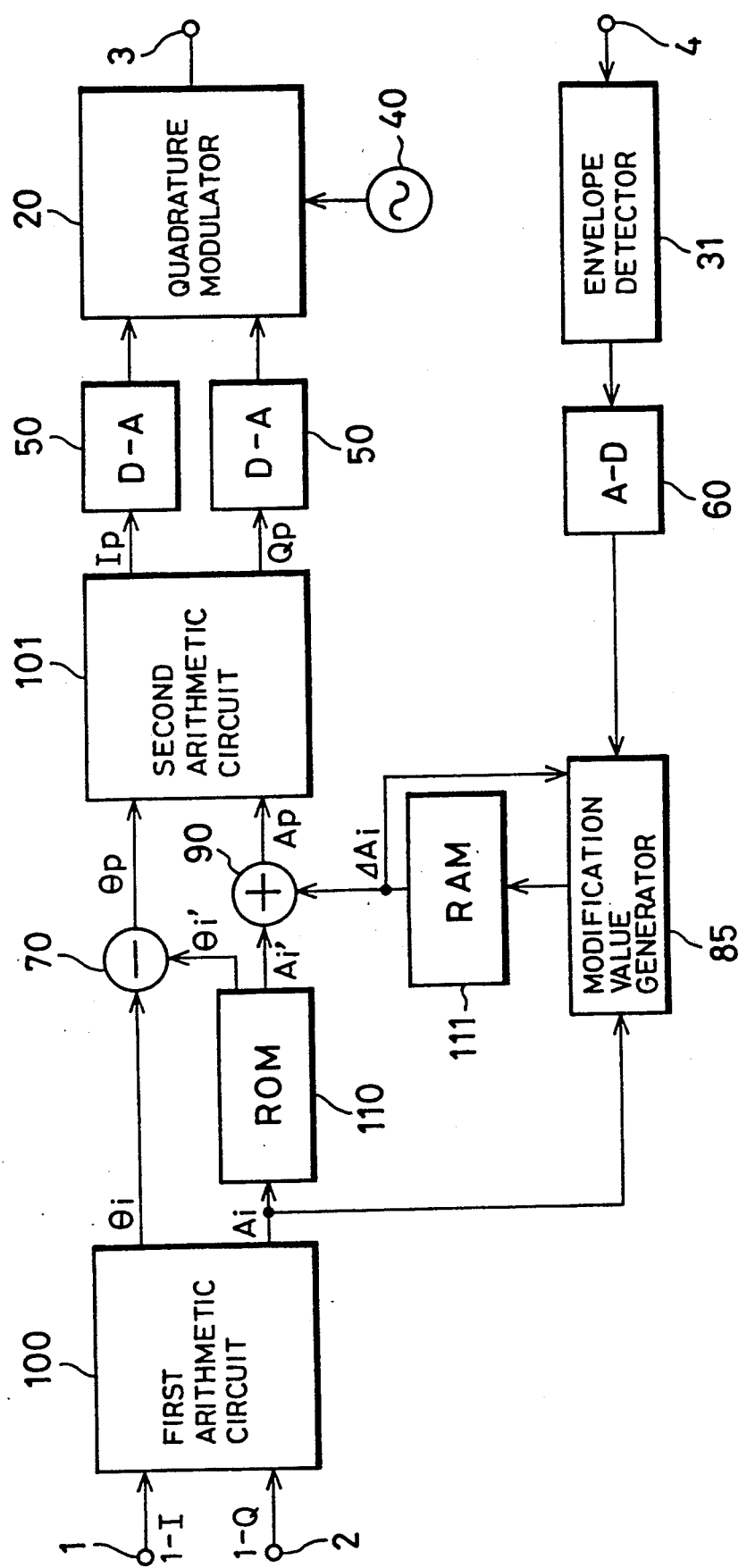

MODULATION DEVICE WITH INPUT SIGNAL MODIFICATION FOR CORRECTION OF AMPLIFIER NONLINEARITIES

BACKGROUND OF THE INVENTION

1. Field of the Invention

This invention relates to a modulation device which modifies an input signal in order to compensate for nonlinear input/output characteristics of an amplifier in a modulation system using an amplitude and a phase of a carrier as information such as a QPSK (quaternary phase shift keying) modulation system.

2. Description of the Prior Art

A recent trend in communication system design has been to narrow the effective frequency band of a channel in order to attempt effective utilization of the available frequency spectrum in radio communication. When a channel band width becomes narrow, deterioration in a transmission signal caused by nonlinearity of a transmitter amplifier becomes a problem. The reason is that intermodulation components of odd orders such as the third order, the fifth order, and the like are generated by the nonlinear input/output characteristic of an amplifier (AM/AM conversion) and drifting of an output signal phase as an input signal amplitude increases (AM/PM conversion), and consequently interference with adjacent channels is easily generated.

As a conventional device for correcting a nonlinear characteristic of an amplifier and correcting changes in the amplifier characteristic caused by temperature changes and the like, there is known a modulation device shown in Japanese Patent Disclosure Publication No. 214843/1986. FIG. 1 is a circuit diagram showing such a conventional modulation device for a quadrature transmission system in which two carriers in phase quadrature are transmitted simultaneously. In FIG. 1, reference numerals 1 and 2 each are an input terminal, reference numeral 3 is an output terminal to an amplifier, 4 is an input terminal into which part of an output of the amplifier is inputted, 10 is a random access memory (RAM) in which data can be rewritten, 20 is a quadrature modulator, 30 is a quadrature demodulator, 40 is an oscillator, 50 is a D-A (digital-analog) converter, 60 is an A-D (analog-digital) converter, 70 is a subtractor circuit, 80 is a modification value generating circuit, and 90 is an adder circuit.

Signals 1-I and 1-Q applied to the input terminals 1 and 2 represent a real part and an imaginary part of a signal series obtained by sample-quantizing a complex signal $S(t) = I \sin \omega_c t + Q \cos \omega_c t$. Modified data for compensating the nonlinearity of the amplifier are stored in the RAM 10, which outputs signals 2-I and 2-Q, corresponding to the signals 1-I and 1-Q, for which the nonlinearity of the amplifier is taken into account. The signals 2-I and 2-Q are converted into analog signals by the D-A converter 50, and modulated in the quadrature modulator 20. On the other hand, part of the output of the amplifier (not shown) which is inputted to the input terminal 4 is demodulated by quadrature demodulator 30, converted into a digital signal by the A-D converter 60, and then subtracted from the data of the input signals 1-I and 1-Q by the subtractor circuit 70. If the nonlinearity of the amplifier has been correctly compensated, the output of the subtractor circuit 70 will be 0. But, in the case where the characteristic of the amplifier changes due to temperature changes and the like, the output of the subtractor circuit 70 will not be 0, and at that time, outputs of the modification value generating circuit 80 are added to the values outputted by the RAM 10, and then the memory location in RAM 10 corresponding to signals 1-I and 1-Q as an address is rewritten by the added values.

In this way, in a conventional modulation device shown in FIG. 1, even in the case where the characteristic of the amplifier varies due to temperature changes and the like, distortions generated in the amplifier are compensated.

However, in such a conventional modulation device as shown in FIG. 1, since the modification for compensation of distortions is carried out for both of the input signals 1-I and 1-Q, a very large capacity of the RAM 10 is needed, for example on the order of 100MB, and there are problems that the modulation device becomes large-sized, its power consumption is large, its cost is high and its efficiency is low.

SUMMARY OF THE INVENTION

This invention solves the problems described above, and it is an object of this invention to reduce the memory capacity of a quadrature modulation device considerably and achieve miniaturization, low power consumption, high operating efficiency, and low cost of the device.

The modulation device according to this invention comprises a first arithmetic circuit for calculating an amplitude Ai and a phase $\theta_i$ of a complex signal from sampled input signals I and Q, a second arithmetic circuit for producing signals Ip and Qp from data corresponding to the calculated amplitude and phase, the signals Ip and Qp corresponding to modifications of signals I and Q so as to compensate distortion of the amplifier due to its nonlinear characteristics, a detector circuit, a modification value generating circuit, and a RAM.

The modulation device of this invention has memory capacity reduced considerably compared with the conventional device since it obtains data for compensating the distortion characteristic of the amplifier from each of an amplitude and a phase. For example, the memory requirements of a device according to the invention are on the order of 100KB. This allows miniaturization, low power consumption, and low cost of the device to be achieved. Also, since part of the output of the amplifier is detected in the same way as the conventional circuit, and the signals Ai and $\theta_i$ are also modified by the detected output, compensation of distortions can be adaptively carried out for changes in the characteristic of the amplifier caused by temperature changes and so forth.

BRIEF DESCRIPTION OF THE DRAWINGS

FIG. 2 is a block diagram showing a quadrature modulation device according to a first embodiment of this invention;

DETAILED DESCRIPTION OF THE PREFERRED EMBODIMENTS

Figure 1:
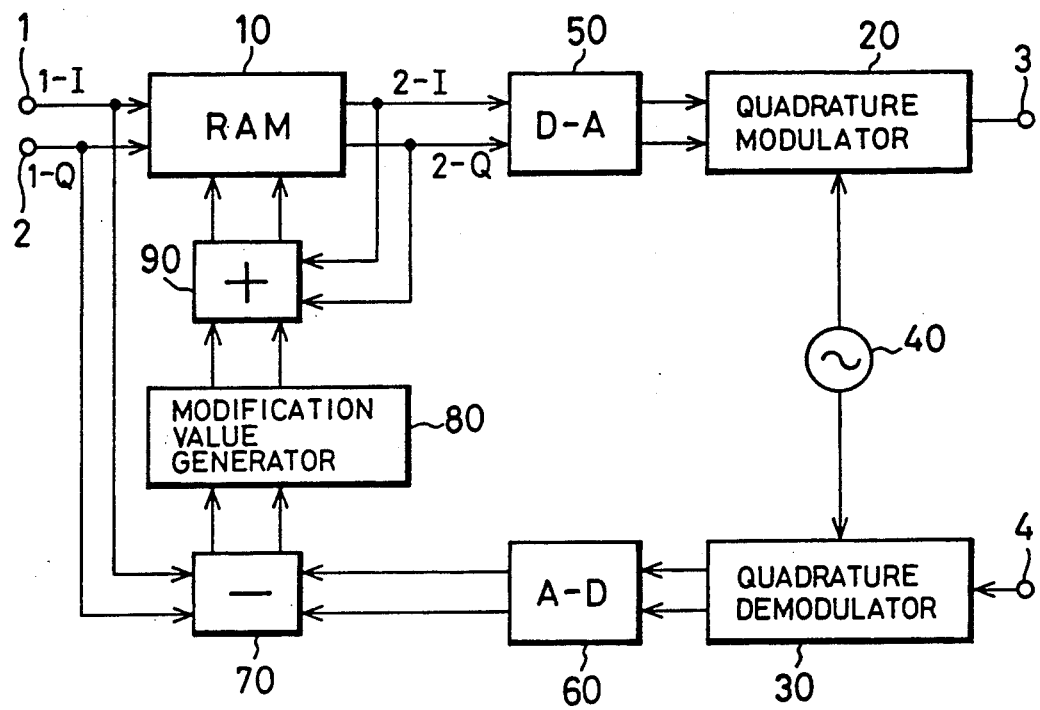
FIG. 1 is a block diagram showing a conventional quadrature transmission modulation device.

FIG. 2 is a block diagram showing a first embodiment of this invention. In FIG. 2, reference numeral 31 is an envelope detection circuit, 85 is a modification value generator, 100 is a first arithmetic circuit, 101 is a second arithmetic circuit, 110 is a ROM (Read Only Memory), and 111 is a RAM which outputs an amount of distortion for amplifier characteristic compensation. The other components are the same as those shown in FIG. 1. The first arithmetic circuit 100 calculates an amplitude Ai and a phase angle $\theta i$ of a complex signal from the input signals 1-I and 1-Q, and the second arithmetic circuit 101 calculates signals Ip and Qp from the amplitude Ap and the angle $\theta p$ of the complex signal modified for compensation of the nonlinearity of the amplifier and changes in characteristics due to temperature changes and the like.

The principle of distortion compensation is described below. An input signal $V_{in}(t)$ of the amplifier in the case where compensation of distortions is not performed is given by the following expression.

$$V_{in}(t) = I(t)\sin(\omega t) - Q(t)\cos(\omega t) \quad (1)$$
$$= Ai(t)\sin\{\omega t + \theta i(t)\}$$

where, $$Ai(t) = \sqrt{I(t)^2 + Q(t)^2} \quad (2)$$

$$\tan\{\theta i(t)\} = Q(t)/I(t) \quad (3)$$

On the other hand, an output signal of the amplifier $V_{out}(t)$ is represented by the following expression.

$$V_{out}(t) = G[Ai(t)] \sin[\omega t + \theta i(t) + \phi\{Ai(t)\}] \quad (4)$$

where G [] represents a gain characteristic containing distortions due to the nonlinearity of the amplifier, and $\phi$[] represents a phase characteristic containing distortions due to the nonlinearity of the amplifier.

The condition that the output of the amplifier contains no distortion is given by $$G_o[Ai(t)]\sin\{\omega t + \theta i(t)\} = \quad (5)$$
$$G[Ap(t)]\sin[\omega t + \theta p(t) + \phi\{Ap(t)\}]$$

where $G_o$ is a linear gain of the amplifier.

$$Ap(t) = \sqrt{Ip(t)^2 + Qp(t)^2} \quad (6)$$

$$\tan\{\theta p(t)\} = Qp(t)/Ip(t) \quad (7)$$

Figure 5A:
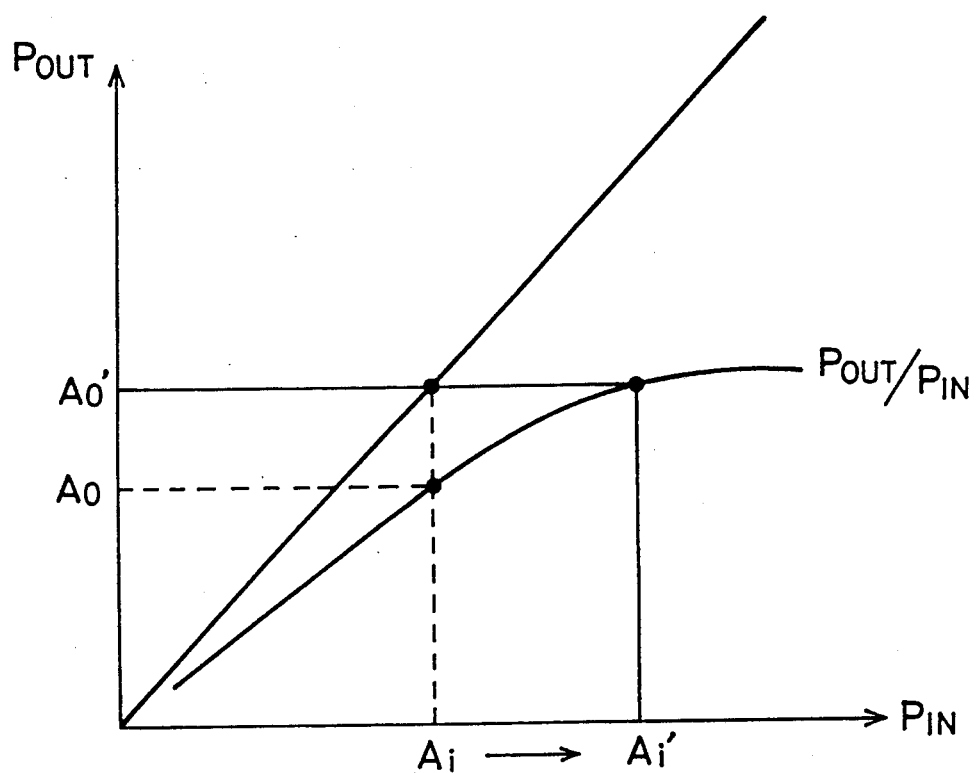
FIGS. 5A and 5B are graphs illustrating the compensation principles of the present invention.
Figure 5B:
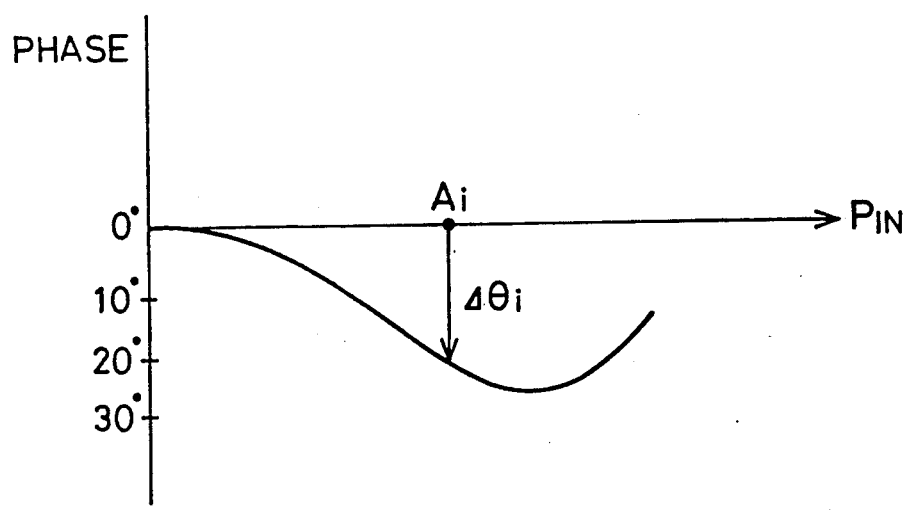

FIG. 5A is a graph illustrating the amplitude distortion caused by the nonlinear input/output characteristic $P_{out}/P_{in}$ of the amplifier, and FIG. 5B is a graph illustrating the phase distortion caused by the amplitude-phase characteristic of the amplifier. As seen in FIG. 5A, for an input signal of amplitude Ai, a desired output amplitude is $A_o$, However, because of the nonlinearity of the amplifier, it outputs a signal having amplitude $A_o$. Similarly as shown in FIG. 5B, an input signal of amplitude Ai will produce an output signal with a phase difference of $\Delta\theta_i$, as opposed to a desired output signal having a phase difference of 0°. The present invention provides for the correction of the input signal amplitude and phase values Ai and $\theta i$ by these predetermined amounts as calculated from the known amplifier characteristics, before the signal is inputted to the amplifier. Thus, the amplifier output signal will correspond to a linear characteristic with no phase or amplitude distortion.

The first arithmetic circuit 100 outputs Ai(t) and $\theta i(t)$ through the operations represented by the expressions 2 and 3. The ROM 110 contains modified data for correction of distortions in the amplifier, and outputs modified data Ai'(t) and Qi'(t) corresponding to input Ai(t). The subtractor circuit 70 calculates $\theta p(t)$ from $\theta i(t)$ and $\theta i'(t)$ and outputs it. On the other hand, the adder circuit 90 calculates Ap(t) from Ai'(t) and an amount of further compensation $\Delta Ai(t)$ (described hereinafter in detail), outputted from the RAM 111, and outputs it. The second arithmetic circuit 101 then calculates signals Ip(t) and Qp(t) for compensating the distortions of the amplifier in accordance with the following expressions and outputs them. That is, Ai'(t) is a compensating amplitude value which is determined in consideration of the output characteristic of the amplifier, and $\theta i'(t)$ is a compensation phase value which is made in consideration of drifting of the output phase of the amplifier due to the input amplitude to the amplifier.

$$Ip(t) = Ap(t) \cos\{\theta p(t)\} \quad (8)$$

$$Qp(t) = Ap(t) \sin\{\theta p(t)\} \quad (9)$$

In order to compensate for changes in the characteristic of the amplifier from temperature changes and so forth, part of the output signal of the amplifier is applied to the input terminal 4 and is envelope-detected in detector 31. The envelope-detected output is converted into a digital signal by the A-D converter 60, and thereafter a difference between the amplitude Ai and the envelope of the amplifier output is detected by the modification value generating circuit 85, which rewrites the corresponding compensation data $\Delta Ai$ RAM 111 in accordance with the difference. RAM 111 outputs the amount of compensation $\Delta Ai(t)$ as modified by the circuit 85.

Consequently, if the characteristic of the amplifier is changed by temperature changes and so forth, only the amplitude characteristic of the amplifier is compensated. Since this circuit compensates temperature distortions of the amplitude characteristics only, compared with the conventional circuit the capacity of the ROM can be reduced. Also, since an envelope detector circuit 31 is used instead of a quadrature demodulator, it is effective for miniaturization, low power consumption, and low cost of the circuit.

Figure 3:
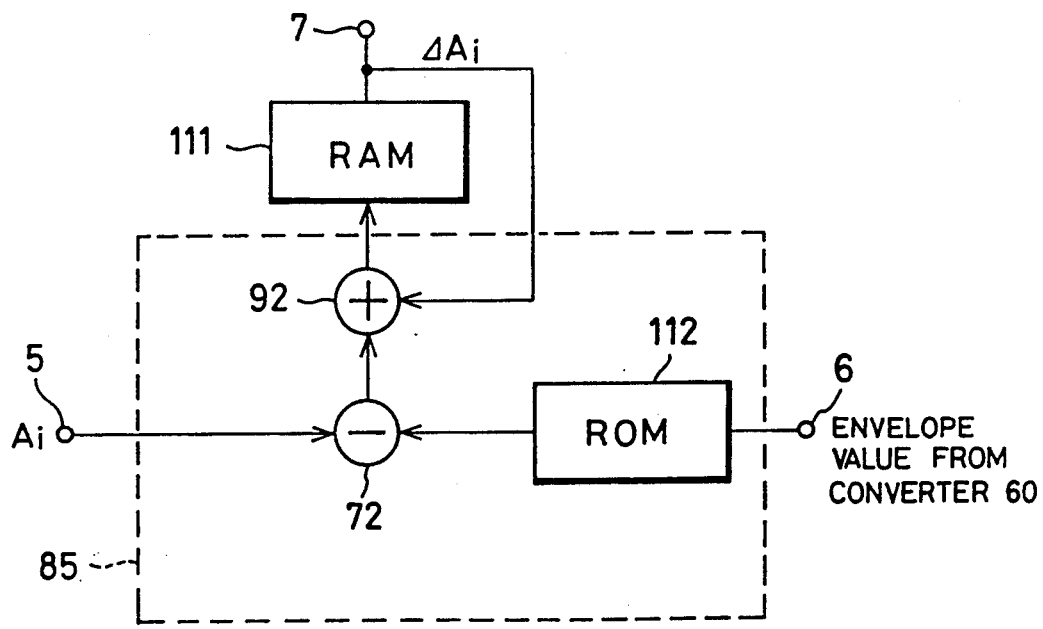
FIG. 3 is a circuit diagram showing the constitution of the modification value generating circuit 85 of FIG. 2.

FIG. 3 is a detailed diagram of the modification value generating circuit 85 FIG. 2, in which the modification value generating circuit 85 comprises a ROM 112, an adder circuit 92, and a subtractor circuit 72. This circuit is different from the conventional circuit 80 in generation of an amount of modification by considering only the amplitude of the signal as opposed to the real and imaginary components I and Q.

In FIG. 3, reference numeral 5 is a terminal into which the amplitude Ai(t) outputted from the first arithmetic circuit 100 is inputted, 6 is a terminal into which a digitized envelope outputted from the A-D converter 60 is inputted, and 7 is a terminal from which a previous amount of compensation $\Delta Ai$ for modifying an input signal is outputted. A ROM 112 outputs an amplitude level before amplification corresponding to the level of the envelope. The difference between this amplitude level and the amplitude Ai(t) is outputted from the subtractor circuit 72. If the difference is 0, contents of the RAM 111 are not rewritten because the previous amount of compensation ΔAi will not be modified in adder 92. However, if the difference is not 0, the difference will be added to the present value ΔAi in the RAM 111 by adder circuit 92, and the modified value ΔAi is written into the RAM 111 as a new amount of compensation replacing the old amount.

Figure 4:
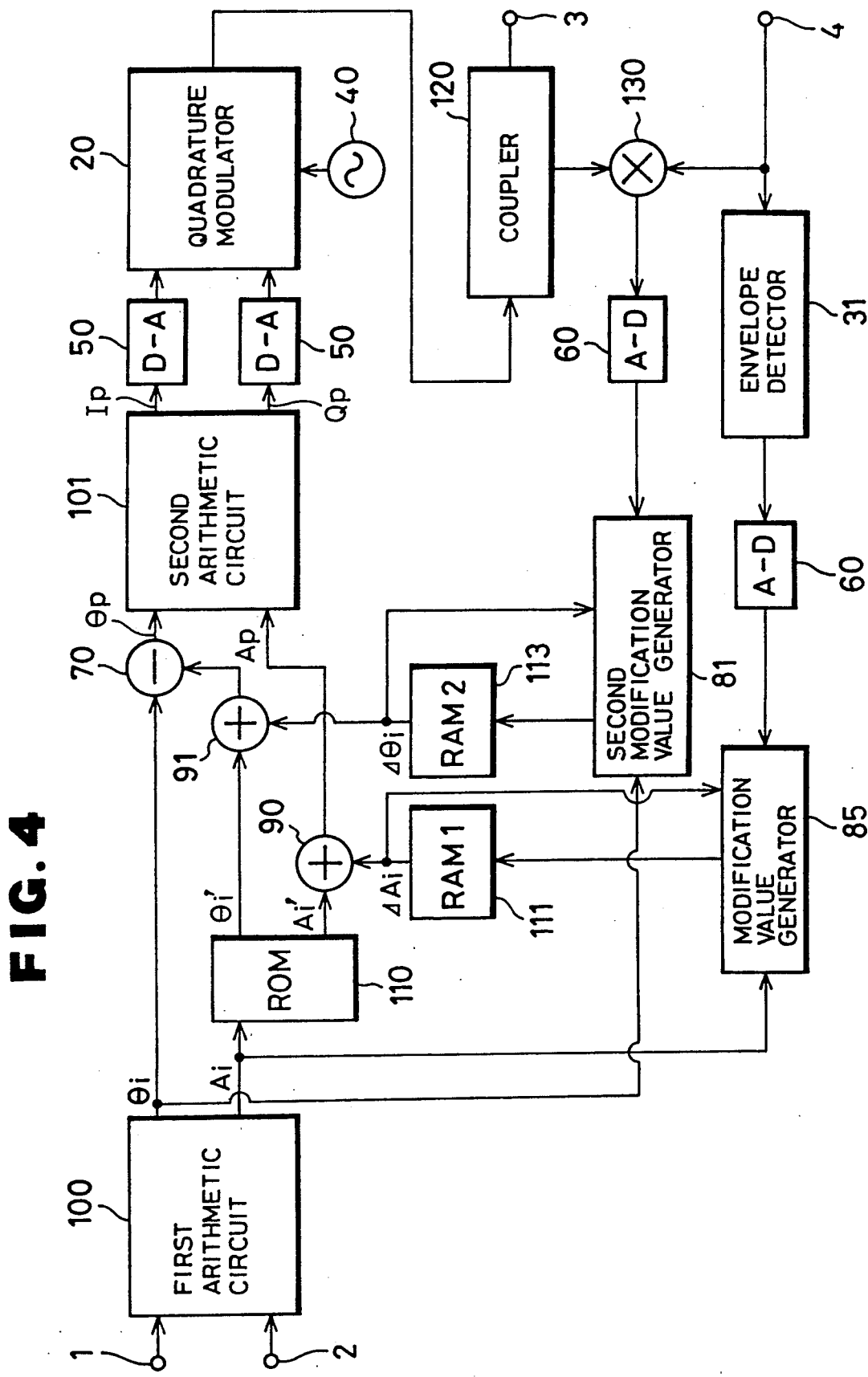
FIG. 4 is a block diagram showing a second embodiment of this invention.

FIG. 4 is a block diagram showing a second embodiment of this invention. In this embodiment, a phase detector circuit 130, a second RAM 113, and a second modification value generating circuit 81 are added to the circuit of FIG. 2 so as to carry out compensation with respect to a phase in addition to amplitude compensation. Though the circuit shown in FIG. 4 can compensate for changes in the characteristic of the amplifier with respect to the phase in the same way as the amplitude, the capacity of the ROM and that of the RAM are still significantly reduced compared with those of the conventional circuit shown in FIG. 1.

In the embodiment shown in FIG. 4, a phase detector circuit 130 detects a phase of an output signal of the amplifier using an input signal for the amplifier extracted from a coupler 120 as a reference signal. The second modification value generating circuit 81 determines the difference between the detected phase from detector 130 and the phase θi of the input signal. If the difference is not 0, the second modification value generating circuit 81 adds the difference to the previous amount Δθi and rewrites the contents of the second RAM 113. The second RAM 113 outputs the new amount of compensation Δθi to an adder circuit 91.

As described above, since the modulation device according to this invention calculates an amplitude and a phase of a complex signal from input signals I and Q in the first arithmetic circuit and calculates signals Ip and Qp from a corrected amplitude and phase in the second arithmetic circuit so as to compensate for distortion in the amplifier, the amplitude and the phase of the input signal can be individually corrected, respectively. Consequently, a small amount of memory is needed for the circuit to be implemented, which is effective for miniaturization, low power consumption, and low cost of the circuit.

WHAT IS CLAIMED IS:

1. A modulation device for modulating a carrier with a sample series of a complex signal and inputting the modulated carrier to an amplifier producing amplitude and phase distortions, comprising:

a first arithmetic circuit for calculating an amplitude and phase of said complex signal from an input sample series;
means for modifying said amplitude and phase of said complex signal based on a result of said calculation to correct said amplitude and phase distortions;
a second arithmetic circuit for calculating a sample series from said modified amplitude and phase; and
modulation means for modulating said carrier with the sample series calculated by said second arithmetic circuit and applying said modulated carrier to said amplifier.

2. A modulation device according to claim 1, further comprising:

detector means for detecting a parameter of an output signal of said amplifier;
means for comparing said output signal parameter with a corresponding parameter of said input sample series and developing a difference signal corresponding to the difference therebetween; and
means for further modifying said amplitude and phase of said complex signal based on the value of said difference signal.

3. A modulation device according to claim 2, wherein said detector means comprises an envelope detector for detecting an envelope of said amplifier output signal, said comparing means comprises means for subtracting the amplitude of said complex signal from an amplitude proportional to said envelope to develop said difference signal, and said means for further modifying comprises memory means for storing said difference signal and means for updating said stored difference signal by the value of a future difference signal developed b said comparing means.

4. A modulation device according to claim 3, further comprising:

phase detector means for detecting a phase of said amplifier output signal;
means for determining a difference between said detected phase and said phase of said complex signal; and
means for further modifying the phase of said complex signal based on the determined phase difference.

5. A modulation device according to claim 4, wherein said further phase modifying means comprises means for storing said determined phase difference and means for updating the stored phase difference by the value of a future phase difference determined by said means for determining.

* * * * *

UNITED STATES PATENT AND TRADEMARK OFFICE
CERTIFICATE OF CORRECTION

PATENT NO. : 5,093,637
DATED : March 3, 1992
INVENTOR(S) : Yoji Isota et al.

It is certified that error appears in the above-identified patent and that said Letters Patent is hereby corrected as shown below:

Column 3, line 45, delete "(5)"; insert --(5)-- at right margin of column.

Column 3, line 60, delete "$A_o,$" and insert --$A_0'.$--.

ON THE TITLE PAGE

Under "Foreign Application Priority Date" change "Dec. 27, 1987" to --Dec. 27, 1989-- .

Signed and Sealed this

Thirty-first Day of August, 1993

*Attest:*

BRUCE LEHMAN

*Attesting Officer*  *Commissioner of Patents and Trademarks*